United States Patent [19]

Baty et al.

[11] 4,049,951
[45] Sept. 20, 1977

[54] DATA RETENTION APPARATUS

[75] Inventors: Charlton Robert Baty, Dartford; Alfred John Jarvis, Walderslade, both of England

[73] Assignee: Decca Limited, London, England

[21] Appl. No.: 629,572

[22] Filed: Nov. 6, 1975

[30] Foreign Application Priority Data

Nov. 7, 1974 United Kingdom ............... 48156/74

[51] Int. Cl.² ...................... G06M 3/14; H03K 21/34
[52] U.S. Cl. ........................... 235/92 FP; 235/92 DP; 235/92 MP; 235/92 R; 307/238
[58] Field of Search ......... 235/92 EA, 92 FP, 92 DP, 235/92 MP, 92 EV; 307/238; 340/172.5

[56] References Cited

U.S. PATENT DOCUMENTS

| 2,982,870 | 5/1961 | Hilbiber | 307/238 |
| 3,286,239 | 11/1966 | Thompson et al. | 340/172.5 |
| 3,321,747 | 5/1967 | Adamson | 340/172.5 |
| 3,350,652 | 10/1967 | Cottrez | 307/238 |
| 3,597,629 | 8/1971 | Bartlett | 307/238 |
| 3,843,873 | 10/1974 | Beville | 235/92 MP |

Primary Examiner—Joseph M. Thesz
Attorney, Agent, or Firm—Edward F. Connors

[57] ABSTRACT

Apparatus for retaining the data held in a directional counter in the event of the voltage level supplied to the counter falling below a predetermined level comprises a directional counter means for comparing the level of voltage supplied to the directional counter with a predetermined voltage level, data storing means responsive to the comparator means for storing the output signal of the directional counter when the voltage falls below the predetermined voltage and for loading the stored output signal into the directional counter when the voltage level subsequently rises above the predetermined level.

13 Claims, 5 Drawing Figures

DATA RETENTION APPARATUS

This invention relates to apparatus for retaining the data held in a directional counter in the event of the voltage level supplied to the counter falling below a predetermined level. Particularly this apparatus is for use in tuning circuits of synthesiser controlled communications receivers.

According to the present invention there is provided an apparatus for retaining the data held in a directional counter in the event of the voltage level supplied to the counter falling below a predetermined level comprising a directional counter, means for comparing the level of voltage supplied to the directional counter with a predetermined voltage level, data storing means responsive to the comparator means for storing the output signal of the directional counter when the voltage falls below the predetermined voltage and for loading the stored output signal into the directional counter when the voltage level subsequently rises above the predetermined level.

The apparatus may further comprise means for producing a first instruction signal in response to activation by an operator, means for providing a second instruction signal in response to activation by an operator means for feeding the first and second instruction signals to the data storing means and including means for inhibiting the feeding of said instruction signals whenever the voltage level falls below the predetermined level, the data storing means being arranged to store the output of the directional counter whenever it receives a first instruction signal and to load the stored output signal into the directional counter when the voltage level subsequently rises above the predetermined level.

The apparatus may still further comprise a rotatable shaft, encoding means for providing a second output signal for each unit of rotation through which the shaft rotates, means for sensing the direction of rotation of the shaft, the directional counter means being arranged to count the second output signals, the direction of the count being determined by the direction sensed by the direction sensing means such that the output signal of the counter represents the rotational position of the shaft.

The apparatus including a rotatable shaft may further comprise an operable mechanism, the operable mechanism being arranged such that operation of the operable mechanism causes signals representing a plurality of units of rotation to be supplied to the counter. The operable mechanism may include at least two push-buttons, the push-buttons being arranged such that operation of one of the push-buttons causes signals representing a plurality of units of rotation in one direction to be supplied to the counter, and such that operation of the other causes signals representing a plurality of units of rotation in the other direction to be supplied to the counter.

The means for storing may be a solid state device having a low power consumption when in its non-switching mode. The solid state device may be provided with a local power source, which may be constituted by a large capacitor.

The rotatable shaft may be the shaft of a tuning knob, in which case the output of the directional counter may be connected to a frequency synthesiser, which may in turn form part of a communications receiver.

According to another aspect of the invention there may be provided a method of retaining the data held in a directional counter in the event of the voltage level supplied to the counter falling below a predetermined level comprising the steps of comparing the level to the voltage supplied to a directional counter with a predetermined voltage level, storing the output signal when the voltage falls below the predetermined level and loading the stored output signal into the directional counter when the voltage level subsequently rises above the predetermined level.

Reference will hereinafter be made to the accompanying drawing in which.

Figure 1:
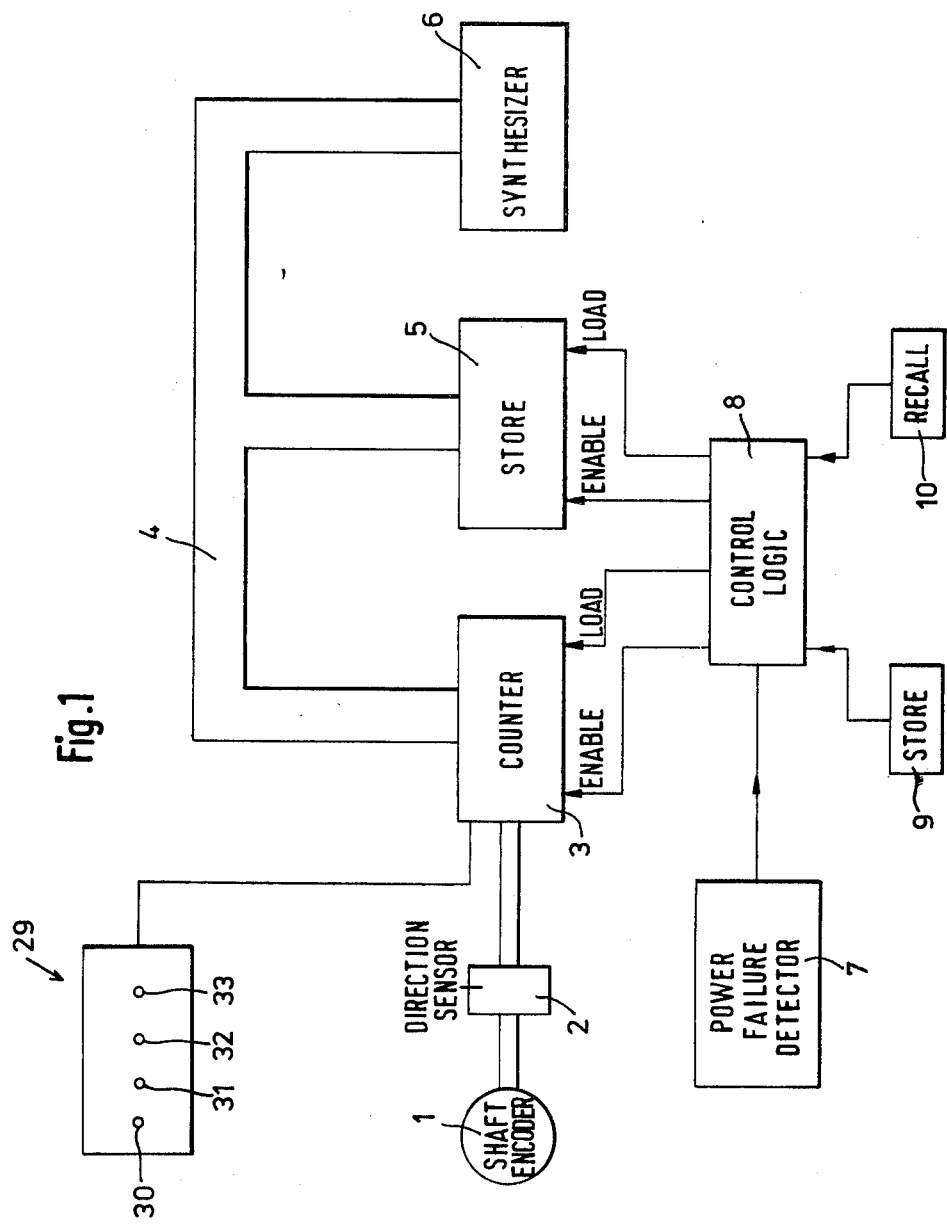
FIG. 1 is a schematic diagram of a tuning apparatus containing apparatus according to the invention.

FIG. 1 shows a shaft encoder 1 connected to a direction sensing device 2, which is in turn connected to a programmable directional counter 3.

The shaft encoder 1 is connected to the shaft of a tuning knob (not shown). The shaft encoder 1 delivers an output signal for each unit of rotation through which the shaft rotates. The direction sensor 2 senses the direction of rotation. The directional counter 3 then either adds or subtracts an increment for each output signal supplied by the encoder 1 from the total contained in the counter 3 at the moment of receipt of that signal. The direction sensed by the direction sensing device 2 determines whether a particular encoder output signal is added or subtracted.

The instantaneous total count contained in the counter 3 is fed via tri-state data bus 4 to a frequency synthesiser 6, the magnitude of the count determining the frequency of oscillation of the synthesiser.

This system of tuning control has the advantage that the receiver may be tuned over a full range using only one knob; however, it has the disadvantage that in the event of a power failure or the equipment being switched off the information contained in the counter 3 is lost.

In order to overcome this disadvantage a counter with low power consumption, such as a complementary metal oxide (C.MOS) counter, could be used and supplied with power from a local voltage source in the form of a large capacitor. This would allow the counter to retain its data for a long period after the main power supply had been interrupted.

However, it is preferably to use a separate C.MOS data store such as 5 in FIG. 1.

A power failure detector 7 is provided to detect any reduction in supply voltage which is likely to endanger the data contained in the counter 3. Whenever such a condition is detected the power failure detector 6 feeds a signal to control logic 8, which, on receipt of the signal from the detector 6, feeds a load instruction to the store 5, which reads the data on the bus 4. The outputs of store 5 being normally disabled.

When the power failure detector 6 detects the return of the supply voltage it feeds a further signal to the control logic 8, which feed an enable instruction signal to store 5, enabling its outputs and hence allowing the stored data to be fed on to the bus 4. At the same time the control logic 8 feeds a load instruction signal to the counter 3 causing it to read the stored data which is available on the bus 4, and hence the counter 3 is reset to its pre-power failure condition. The control logic 8 then feeds an enable instruction to the counter 3, which connects the counter 3 to the bus and the instantaneous total count is once more fed to the frequency synthesiser, which has already been 're-set' by the appearance of the stored data on the bus 4.

"Store" and "RECALL" push buttons 9 and 10 are also connected to the control logic 8 to allow data to be stored and recalled at the will of the operator. Activation of button 9 causes a signal corresponding to the power failure detected signal to be fed to the control logic 8 and activation of button 10 causes a signal corresponding to the power restored signal to the control logic 8. Should a power failure occur while the stored data is held in the store 5, then the store 5 is cleared and the instantaneous count on the counter 3 is fed into the store 5.

Figure 2:
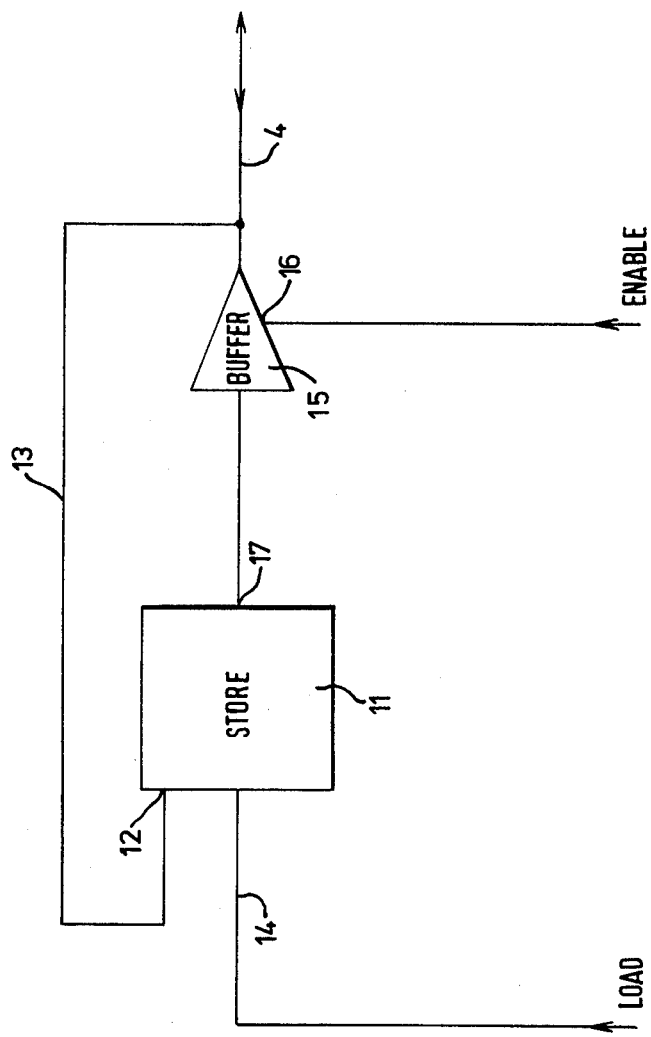
FIG. 2 is a schematic diagram of a store for use with the apparatus of FIG. 1.

FIG. 2 shows the store 5 in more detail. A memory 11, which is preferably a D-type flip-flop has a first input 12, which is connected to the bus 4 by line 13 and a second or load input 14, which is connected to the control logic 8. The output of the memory 11 is connected to a three state buffer 15 which is in turn connected to bus 4. Buffer 15 has a control input 16 which is connected to control logic 8.

In operation the memory 11 reads the data on input 12, and hence on bus 4, whenever a load instruction signal is fed to input 14 i.e. whenever a power failure detector is detected or the store button is pushed. The stored data becomes instantaneously available on output 17 of the memory 11, but the buffer 15 prevents the stored data being fed back onto bus 4 until an enable instruction signal is received at control input 16 from the control logic 8.

Figure 3:
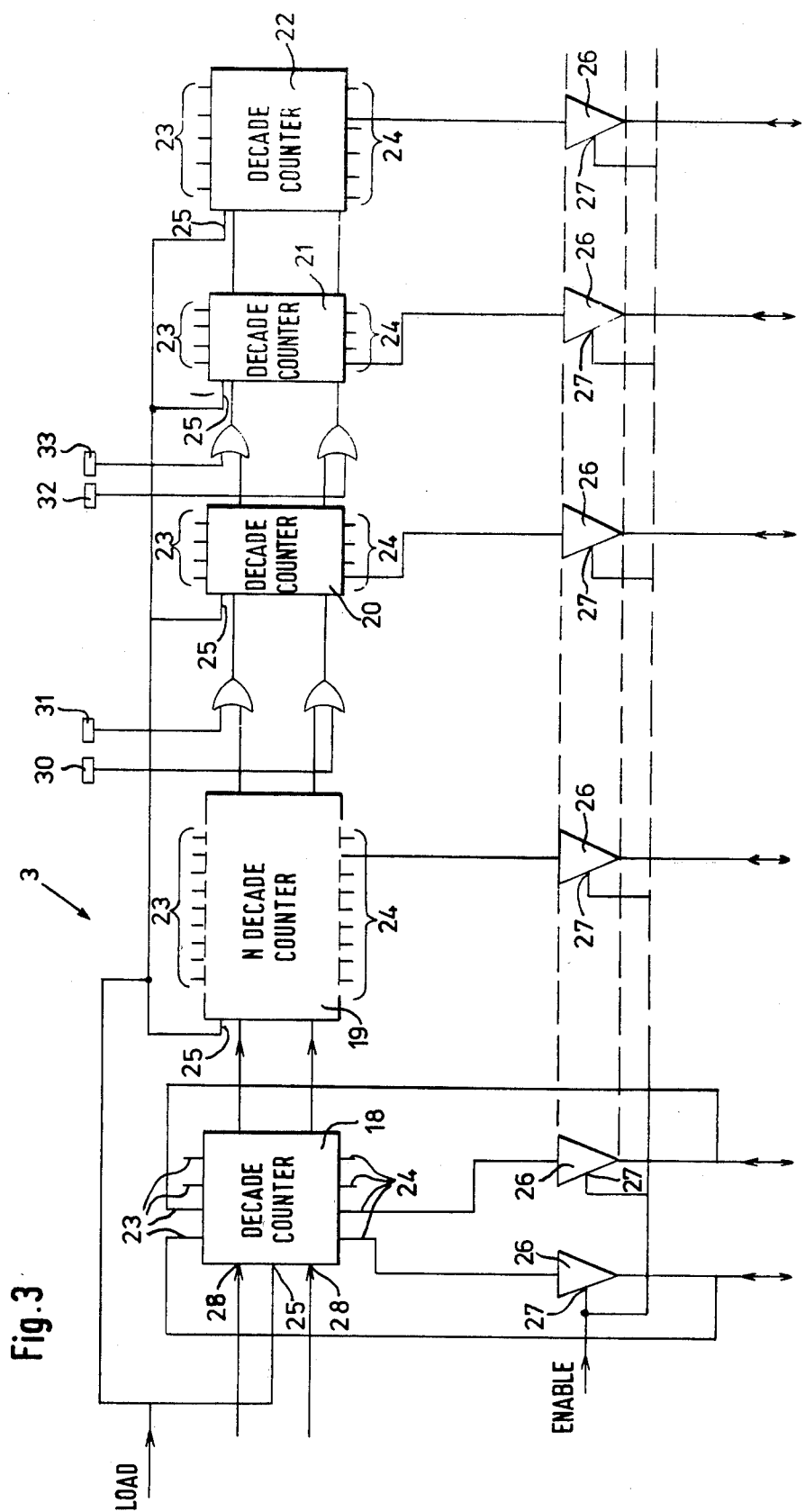
FIG. 3 is a schematic diagram of a directional counter for use with the apparatus of FIG. 1.

FIG. 3 shows the directional counter 3 in more detail. The directional counter 3 consists of counter 18, 19, 20, 21 and 22 connected in series, each having first inputs 23 connected to the corresponding outputs 24, the first inputs 23 being arranged such that the data on the first inputs 23 is only read into respective counters when a load instruction signal is present on load inputs 25. The outputs 24 are each connected to a respective three state buffer 26, which passes a signal whenever an enable instruction signal is present on its respective control input 27. Second inputs 28 of counter 18 are connected to the output of shaft encoder and direction sensor 2.

In normal operation the counter 18 receives the output signals from the shaft encoder 1 and direction sensor 2 via second inputs 28 and counts in the appropriate direction. Whenever the count passes through 'ten' or 'zero', the counter 18 feeds a unitary count signal to four decade counter 19. Counter 19 feeds a unitary count output signal everytime a hundred thousand is passed through, and similarly counter 20 gives a unitary count output signal everytime it passes through the million.

The instantaneous stored count is fed from outputs 24, via buffers 26, on to bus 4.

When the recovery of the supply voltage is detected or the recall button is pushed, the control logic 8 removes the enable instruction signal from inputs 27, effectively disabling the outputs 24. When the store 5 has fed its stored data on to bus 4, the control logic 8 sends a load instruction signal to load inputs 25, which enables first inputs 23 to load the data available on the bus 4 into counters 18 to 22. The control logic 8 then reapplies the enable instruction signal to inputs 27, and the instantaneous count is fed on to bus 4.

The tuning part of the circuit so far described represents a most basic type, and it is desirable to add additional features in order to make the system practical. Thus if the encoder produces 150 output signals per revolution, each output signal causing a 10 Hz increment, this is equal to 1.5 KHz per revolution which is a satisfactory tuning rate. However, if one then wishes to change the frequency by 15 MHz, 10,000 revolutions would be required, which is impractical.

This impracticality can be overcome by introducing to the system push button mechanism, generally indicated at 29 in FIGS. 1 and 3.

Push button mechanism comprises four buttons 30 to 33 and a pulse generator (not shown) the pulse generator being arranged such that whenever a button is depressed pulses are delivered to respective inputs of counters, 20 and 21 at a continuous rate, say 3 per second. Each pulse represents a unitary count signal and depending which button is depressed the frequency of the synthesiser can be changed upwards or downwards in either 100 KHz or 1MHz steps.

We claim:

1. Tuning apparatus including:
   a rotatable tuning shaft;
   encoding means for providing a first output signal for each unit of rotation through which the shaft rotates;
   means for sensing a direction of rotation of the shaft;
   directional counter means for providing a tuning output signal, the directional counter means being coupled to the encoding means and the direction of sensing means to count the first output signals, the direction of the count being determined by the direction sensed by the directional sensing means such that the instantaneous count in the directional counter means represents the rotational position of the rotatable tuning shaft;
   means for comparing the level of the voltage supplied to the directional counter means with a predetermined voltage level; and,
   data storing means responsive to the comparing means for storing the output signal of the directional counter means when the voltage level falls below the predetermined level and for loading the stored output signal into the directional counter means when the voltage level subsequently rises above the predetermined level.

2. Apparatus as claimed in claim 1, further comprising means of producing first instruction signal in response to activation by an operator, means for providing a second instruction signal in response to activation by an operator, means for feeding the first and second instruction signals to the data storing means, the data storing means being arranged to store the output of the directional counter whenever it receives a first instruction signal and to load the stored output signal into the directional counter means when it receives the second instruction signal.

3. Apparatus as claimed in claim 1, further comprising an operable mechanism arranged so that the operation of the mechanism causes signals representing a plurality of units of rotation to be supplied to the counter.

4. Apparatus as claimed in claim 3, wherein the operable mechanism includes at least two push-buttons arranged so that the operation of one of the push-buttons causes signals representing a plurality of units of rotation in one direction to be supplied to the directional counter means, and so that the operation of the other causes signals representing a plurality of units of rotation in the other direction to be supplied to the directional counter means.

5. Apparatus as claimed in claim 1, wherein the means for storing is constituted by a solid state device having a low power consumption in its non-switching mode.

6. Apparatus as claimed in claim 5, wherein the means for storing further comprises a local power source.

7. Counter apparatus comprising:
a rotatable shaft;
encoding means providing a first output signal for each unit of rotation through which the shaft rotates; means for sensing the direction of rotation of the shaft;
directional counter means coupled to the encoder means and the directional sensing means to count the first output signals, the direction of the count being determined by the direction sensed by the direction sensing means such that the instantaneous count in the directional counter means represents the rotational position of the shaft;
means for comparing the level of the voltage supplied to the directional counter means with a predetermined voltage level;
data storing means responsive to the means for comparing for storing the output signal of the directional counter means when the voltage level falls below the predetermined level and for loading the stored output signal into the directional counter means when the voltage level subsequently rises above the predetermined level; and an operable mechanism for causing signals representing a plurality of units of rotation to be supplied to the directional counter means and including at least two push-buttons, the push-buttons being arranged such that the operation of one of the push-buttons causes signals representing a plurality of units of rotation in one direction to be supplied to the counter, and such that the operation of the other causes signals representing a plurality of units for rotation in the other direction to be supplied to the counter.

8. Apparatus as claimed in claim 1, further comprising means for producing first instruction signal in response to activation by an operator, means for providing a second instruction signal in response to activation by an operator, means for feeding first and second instruction signals to the data storing means, the data storing means being arranged to store the output of the directional counter means whenever it receives a first instruction signal and to load the stored output signal into the directional counter means when it receives the second instruction signal.

9. Apparatus as claimed in claim 7, wherein the means for storing is constituted by a solid state device having a low power consumption when in its nonswitching mode.

10. A tuning circuit for a frequency synthesizer comprising the apparatus as claimed in claim 7, wherein the rotatable shaft is the shaft of a tuning knob.

11. An apparatus for retaining the data held in a directional counter in the event of the voltage level supplied to the counter falling below a predetermined level comprising;
directional counter means;
means for comparing the level of the voltage supplied to the directional counter means with a predetermined voltage level;
data storing means responsive to the means for comparing for storing the output signals of the directional counter means when the voltage level falls below the predetermined level and for loading the stored output signal into the directional counter when the voltage level subsequently rises above the predetermined level; and,
an operable mechanism for causing signals representing a plurality of units for rotation to be supplied to the directional counter means whenever the mechanism is operated, the operable mechanism including at least two push-buttons arranged such that the operation of one of the push-buttons causes signals representing a plurality of units for rotation in one direction to be supplied to the directional counter means, and such that operation of the other causes signals representing a plurality of units for rotation in the other direction to be supplied to the directional counter means.

12. Apparatus as claimed in claim 11, further comprising means for producing first instruction signal in response to activiation by an operator, means for employing a second instruction signal in response to activation by an operator, means for feeding the first and second instruction signals to the data storing means, the data storing means being arranged to store the output of the directional counter means whenever it receives the first instruction signal and to load the stored output signal into the directional counter means when it receives a second instruction signal.

13. Apparatus as claimed in claim 11, wherein the means of storing is constituted by a solid state device having a lower power consumption in its non-switching mode.

* * * * *